(12) United States Patent
Kim et al.

(10) Patent No.: US 8,466,458 B2
(45) Date of Patent: Jun. 18, 2013

(54) ORGANIC LIGHT-EMITTING DEVICE

(75) Inventors: Tae-Shick Kim, Yongin (KR);
Dong-Heon Kim, Yongin (KR);
Kwan-Hee Lee, Yongin (KR);
Choon-Woo Lim, Yongin (KR);
Jae-Hyun Kwak, Yongin (KR);
Jung-Ha Son, Yongin (KR); Min-Seung Chun, Yongin (KR); Young-Ho Park, Yongin (KR); Kyung-Hoon Choi, Yongin (KR); Mi-Kyung Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 278 days.

(21) Appl. No.: 12/946,144

(22) Filed: Nov. 15, 2010

(65) Prior Publication Data
US 2011/0114930 A1    May 19, 2011

(30) Foreign Application Priority Data
Nov. 13, 2009 (KR) .................. 10-2009-0109703

(51) Int. Cl.
*H01L 29/08* (2006.01)

(52) U.S. Cl.
USPC ............... 257/40; 257/59; 257/67; 257/79; 257/82; 257/88

(58) Field of Classification Search
None
See application file for complete search history.

(56) References Cited

U.S. PATENT DOCUMENTS

| | | |
|---|---|---|
| 2006/0076885 A1 | 4/2006 | Kim et al. |
| 2006/0194074 A1* | 8/2006 | Funahashi ............... 428/690 |
| 2006/0240277 A1 | 10/2006 | Hatwar et al. |
| 2007/0096644 A1 | 5/2007 | Nishimura et al. |
| 2008/0213620 A1 | 9/2008 | Kim et al. |
| 2008/0220285 A1 | 9/2008 | Vestweber et al. |
| 2009/0009060 A1 | 1/2009 | Kathirgamanathan et al. |
| 2009/0128012 A1 | 5/2009 | Song et al. |
| 2009/0189521 A1 | 7/2009 | Chun et al. |
| 2010/0289008 A1 | 11/2010 | Jang et al. |
| 2011/0210323 A1 | 9/2011 | Imai |

FOREIGN PATENT DOCUMENTS

| | | |
|---|---|---|
| JP | 2000-306670 A | 11/2000 |
| JP | 2008-537314 A | 9/2008 |
| JP | 2009-124138 A | 6/2009 |
| JP | 2009-156913 A | 7/2009 |
| JP | 2009-530809 A | 8/2009 |
| JP | 2010-123704 A | 6/2010 |
| KR | 10-2005-0010682 | 1/2005 |
| KR | 10-2006-0032099 | 4/2006 |
| KR | 10-2007-0004719 | 1/2007 |
| KR | 10-2007-0045997 | 5/2007 |
| KR | 10-2008-0015865 | 2/2008 |
| KR | 10-0846597 | 7/2008 |
| KR | 10-2009-0082778 | 7/2009 |

OTHER PUBLICATIONS

Korean Notice of Allowance issued by KIPO on Mar. 29, 2012 corresponding to KR 10-2009-0109703 and Request for Entry attached herewith.

* cited by examiner

*Primary Examiner* — Kyoung Lee
(74) *Attorney, Agent, or Firm* — Robert E. Bushnell, Esq.

(57) ABSTRACT

An organic light-emitting device including a mixed organic layer that includes a triphenyl amine derivative and a pyrazine derivative and an emission layer that includes an anthracene derivative, an amine-containing styryl derivative, or any mixture thereof.

20 Claims, 1 Drawing Sheet

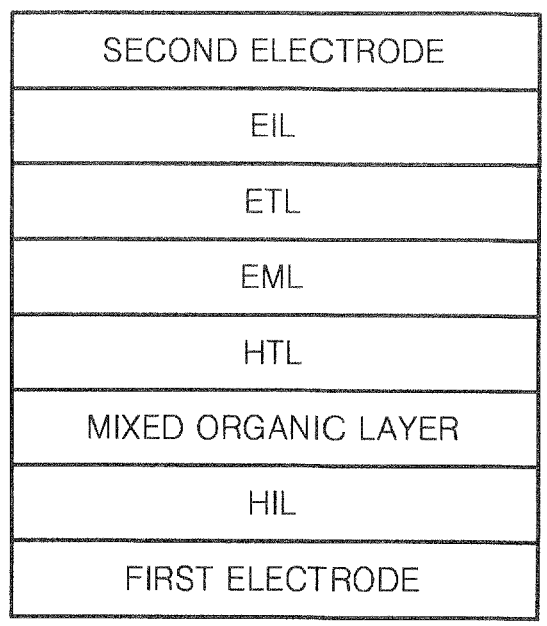

ORGANIC LIGHT-EMITTING DEVICE

CROSS-REFERENCE TO RELATED PATENT APPLICATION

This application claims the benefit of Korean Patent Application No. 10-2009-0109703, filed on Nov. 13, 2009, in the Korean Intellectual Property Office, the disclosure of which is incorporated herein in its entirety by reference.

BACKGROUND OF THE INVENTION

1. Field of the Invention

The present invention relates to an organic light-emitting device including a mixed organic layer that includes a pyrazine derivative and an emission layer that includes an anthracene derivative, an amine-containing styryl derivative, or any mixture thereof.

2. Description of the Related Art

Organic light-emitting devices emit light when electrons and holes are re-combined in an organic layer when a current is supplied to the organic layer interposed between a pair of electrodes. Accordingly, organic light-emitting devices are suitable for light and thin display devices providing high-quality images, quick response, and wide viewing angles. Due to theses characteristics, organic light-emitting device are widely applied not only to mobile phones but also to high fidelity information display devices. However, there is still a need to develop organic light-emitting devices to improve the emission efficiency and lifetime and reduce the power consumption thereof.

Tetrafluorotetracyanoquinonedimethane (F4TCNQ) has been doped on a hole injection layer and/or a hole transport layer of an organic light-emitting device to reduce power consumption. However, due to a very low molecular weight of F4TCNQ, a chamber may be contaminated during a deposition process and the emission efficiency of an emission layer may be quenched.

SUMMARY OF THE INVENTION

The present invention provides an organic light-emitting device.

According to an aspect of the present invention, there is provided an organic light-emitting device including a first electrode, a second electrode, an emission layer interposed between the first electrode and the second electrode, and a mixed organic layer interposed between the first electrode and the emission layer, wherein the mixed organic layer includes a triphenyl amine derivative and a pyrazine derivative, and the emission layer includes an anthracene derivative, an amine-containing styryl derivative, or any mixture thereof.

According to an aspect of the present invention, the organic light-emitting device further includes a hole transport layer between the emission layer and the mixed organic layer, or between the mixed organic layer and the first electrode.

According to an aspect of the present invention, an organic light-emitting device includes a first electrode, a second electrode, an emission layer interposed between the first electrode and the second electrode, the emission layer including an anthracene derivative, an amine-containing styryl derivative, or a mixture thereof, the anthracene derivative, and a mixed organic layer interposed between the first electrode and the emission layer, the mixed organic layer including a triphenyl amine derivative and a pyrazine derivative, the triphenyl amine derivative selected from the group consisting of triphenyl amine, tritolylamine, tolyldiphenylamine, N,N'-diphenyl-N,N'-(3-methylphenyl)-1,1-biphenyl-4,4'-diamine, N,N,N',N'-tetra(4-methylphenyl)-1,1'-phenyl-4,4'-diamine, N,N,N',N'-tetra(4-methylphenyl)-1,1'-biphenyl-4,4'-diamine, N,N'-diphenyl-N,N'-di(1-naphthyl)-1,1'-biphenyl-4,4'-diamine, N,N'-di(methylphenyl)-N,N'-di(4-n-butylphenyl)-phenanthrene-9,10-diamine, 4,4',4"-tris(3-methylphenyl)-N-phenylamino)triphenyl amine, 1,1-bis(4-di-p-tolylaminophenyl)cyclohexane, an oligomer or polymer having an aromatic tertiary amine structure thereof, 4,4'-bis(9-carbazolyl)-1,1'-biphenyl, 4,4'-bis(3-methyl-9-carbazolyl)-1,1'-biphenyl, 4,4',4"-tris(3-methylphenylamino)triphenylamine (m-MTDATA), N,N'-bis(3-methylphenyl)-N,N'-diphenyl-[1,1-biphenyl]-4,4'diamine (TPD), 4,4',4"-tri(N-carbazoyl)triphenyl amine(TCTA), substituted or unsubstituted spirofluorene, substituted or unsubstituted indenofluorene, substituted or unsubstituted benzofluorene, a compound respresented by one of Formulae 4 through 12, and a combination thereof, the pyrazine derivative represented by Formula 13:

<FORMULA 4>

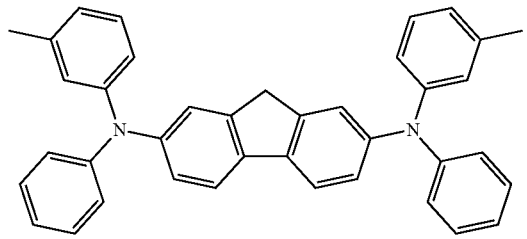

<FORMULA 5>

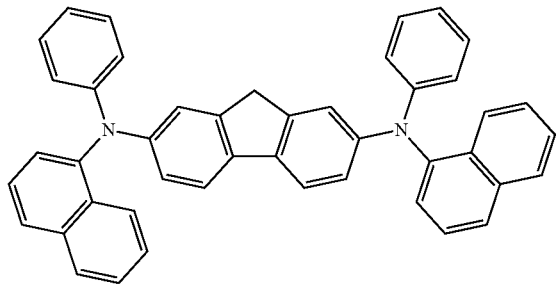

<FORMULA 6>

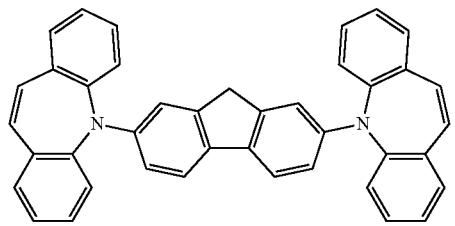

<FORMULA 7>

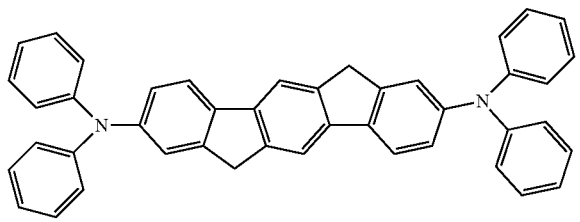

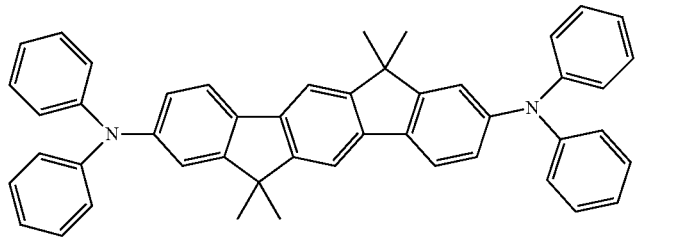
<FORMULA 8>
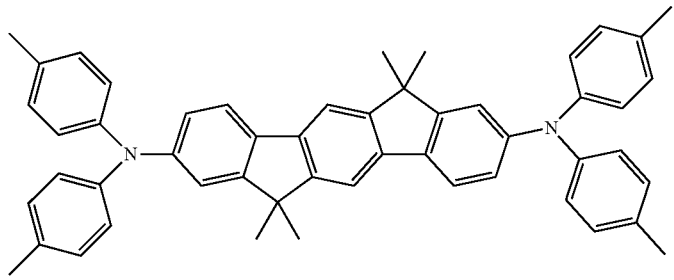
<FORMULA 9>
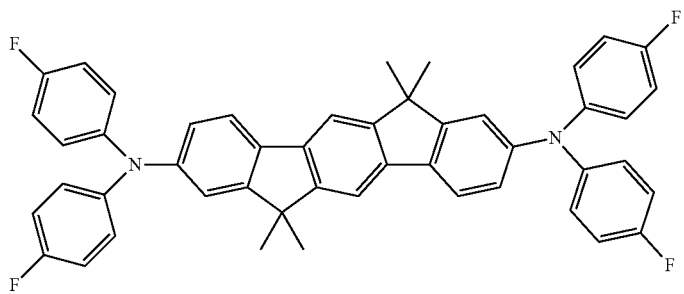
<FORMULA 10>
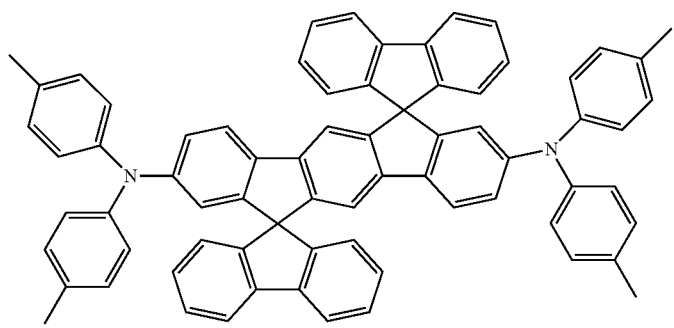
<FORMULA 11>
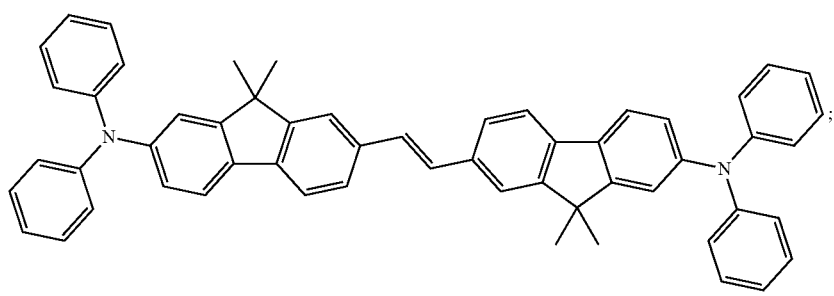
<FORMULA 12>

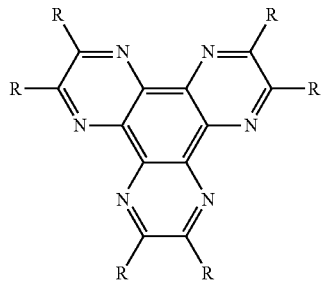

where R is a hydrogen atom, a C1-C10 alkyl group, an alkyloxy group, a dialkyl amine group, a halogen atom, or a cyano group.

BRIEF DESCRIPTION OF THE DRAWINGS

The above and other features and advantages of the present invention will become more apparent by describing in detail exemplary embodiments thereof with reference to the attached drawings in which:

FIG. 1 is a diagram illustrating a structure of an organic light-emitting device according to an embodiment of the present invention; and

DETAILED DESCRIPTION OF THE INVENTION

Hereinafter, an organic light-emitting device according to an embodiment of the present invention will now be described more fully with reference to the accompanying drawings, in which exemplary embodiments of the invention is shown.

In an organic light-emitting device shown in FIG. 1, a first electrode, a hole injection layer (HIL), a mixed organic layer, a hole transport layer (HTL), an emission layer (EML), an electron transport layer (ETL), an electron injection layer (EIL), and a second electrode are formed on a substrate.

Even though the mixed organic layer is interposed between the hole injection layer (HIL) and the hole transport layer (HTL) in FIG. 1, the position of the mixed organic layer is not limited thereto. The mixed organic layer may be positioned between the first electrode and the emission layer (EML). For example, the mixed organic layer may also be disposed between the first electrode and the hole injection layer (HIL), between the hole transport layer (HTL) and the emission layer (EML), or in the hole transport layer (HTL). Also, the hole injection layer (HIL) may not be formed. The substrate may be any substrate that is commonly used in organic light-emitting devices, and may be, for example, a glass substrate or a transparent plastic substrate, which have excellent mechanical strength, thermal stability, transparency, surface smoothness, handling convenience, and water resistance.

The first electrode is formed on the substrate of the organic light-emitting device by depositing or sputtering a material used to form a first electrode and has a high work function. The material used to form the first electrode may include indium tin oxide (ITO), indium zinc oxide (IZO), tin oxide ($SnO_2$), zinc oxide (ZnO), aluminum (Al), silver (Ag), magnesium (Mg), or the like which have excellent conductivity, and may form a transparent or reflective electrode.

The hole injection layer (HIL) may be formed on the first electrode using any material that is commonly used in the art or may not be formed at all. The material used to form the hole injection layer (HIL) may include a phthalocyanine compound such as copper phthalocyanine, an amine derivative such as 4,4',4''-tri(N-carbazolyl)triphenyl amine (TCTA), 4,4',4''-tris(3-methylphenylamino)triphenylamine (m-MTDATA), and 4,4',4''-tris(3-methylphenylamino)phenoxybenzene (m-MTDAPB), a soluble conductive polymer such as polyaniline/dodecylbenzenesulfonic acid (Pani/DBSA) and poly(3,4-ethylenedioxythiophene)/poly(4-styrenesulfonate) (PEDOT/PSS), and a known hole injecting material such as polyaniline/camphor sulfonic acid (Pani/CSA) and polyaniline/poly(4-styrenesulfonate) (PANI/PSS).

A triaryl amine-based compound, as a hole transporting material, may be formed on the hole injection layer (HIL) using vacuum thermal deposition or spin coating to form the hole transport layer (HTL). The triaryl amine-based compound may include triphenyl amine, tritolylamine, tolyldiphenylamine, N,N'-diphenyl-N,N'-(3-methylphenyl)-1,1-biphenyl-4,4'-diamine, N,N,N',N'-tetra(4-methylphenyl)-1,1'-phenyl-4,4'-diamine, N,N,N',N'-tetra(4-methylphenyl)-1,1'-biphenyl-4,4'-diamine, N,N'-diphenyl-N,N'-di(1-naphthyl)-1,1'-biphenyl-4,4'-diamine, N,N'-di(methylphenyl)-N,N'-di(4-n-butylphenyl)-phenanthrene-9,10-diamine, 4,4',4''-tris(3-methylphenyl)-N-phenylamino)triphenyl amine, 1,1-bis(4-di-p-tolylaminophenyl)cyclohexane, and oligomers or polymers having an aromatic tertiary amine structure thereof, but is not limited thereto.

The thickness of the hole transport layer (HTL) may be in the range of about 3 to about 180 nm.

The organic light-emitting device may include the mixed organic layer. The mixed organic layer may be positioned between the first electrode and the emission layer (EML). For example, the mixed organic layer may be formed between the first electrode and the hole injection layer (HIL), between the first electrode and the hole transport layer (HTL), between the hole injection layer (HIL) and the hole transport layer (HTL), between the hole transport layer (HTL) and the emission layer (EML), in the hole transport layer (HTL), or in the hole injection layer (HIL), wherein the mixed organic layer is formed by doping a pyrazine derivative on a triphenyl amine derivative used as a host. The organic light-emitting device according to the present embodiment including the mixed organic layer in which the pyrazine derivative is doped on the triphenyl amine derivative may have a significantly reduced driving voltage when compared to a conventional organic light-emitting device that does not include a mixed organic layer in which the pyrazine derivative is doped on the triphenyl amine derivative.

The triphenyl amine derivative used as a host for the mixed organic layer may include triphenyl amine, tritolylamine, tolyldiphenylamine, N,N'-diphenyl-N,N'-(3-methylphenyl)-1,1-biphenyl-4,4'-diamine, N,N,N',N'-tetra(4-methylphenyl)-1,1'-phenyl-4,4'-diamine, N,N,N',N'-tetra(4-methylphenyl)-1,1'-biphenyl-4,4'-diamine, N,N'-diphenyl-N,N'-di(1- naphthyl)-1,1'-biphenyl-4,4'-diamine, N,N'-di (methylphenyl)-N,N'-di(4-n-butylphenyl)-phenanthrene-9,10-diamine, 4,4',4"-tris(3-methylphenyl)-N-phenylamino) triphenyl amine, 1,1-bis(4-di-p-tolylaminophenyl) cyclohexane, and oligomers or polymer having an aromatic tertiary amine thereof.

In addition, the triphenyl amine derivative may be a compound having a carbazole moiety, and may include 4,4'-bis (9-carbazolyl)-1,1'-biphenyl, 4,4'-bis(3-methyl-9-carbazolyl)-1,1'-biphenyl, 4,4',4"-tris(3-methylphenylamino) triphenylamine (m-MTDATA), N,N'-bis(3-methylphenyl)-N,N'-diphenyl-[1,1-biphenyl]-4,4'diamine (TPD), 4,4',4"-tri (N-carbazoyl)triphenyl amine(TCTA), or the like, but is not limited thereto.

In addition, the triphenyl amine derivative may be a compound having a fluorene moiety that may be substituted or unsubstituted spirofluorene, substituted or unsubstituted indenofluorene, or substituted or unsubstituted benzofluorene as shown below.

<FORMULA 1>

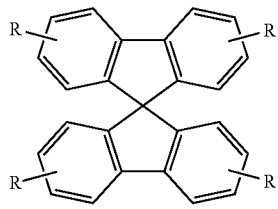

Spirofluorene

<FORMULA 2>

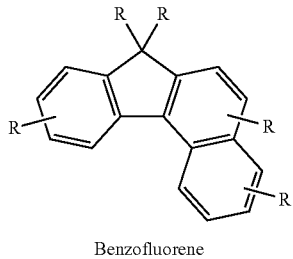

Benzofluorene

<FORMULA 3>

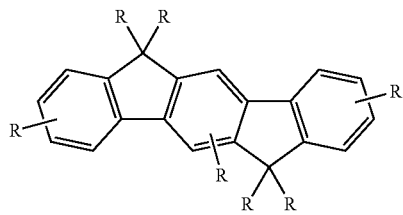

Indenofluorene where R is a hydrogen atom, a C1-C10 alkyl group, an alkyloxy group, a dialkyl amine group, a halogen atom, or a cyano group.

The triphenyl amine derivative having the fluorene moiety may include compounds shown below, but is not limited thereto.

<FORMULA 4>

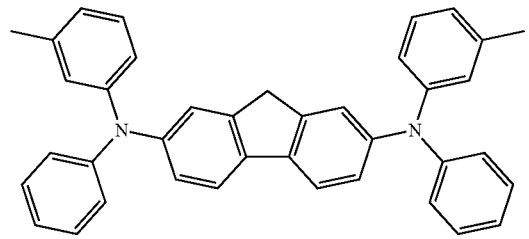

<FORMULA 5>

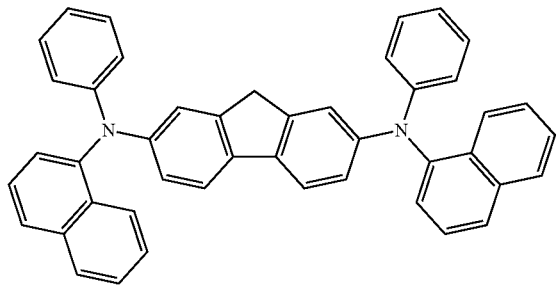

<FORMULA 6>

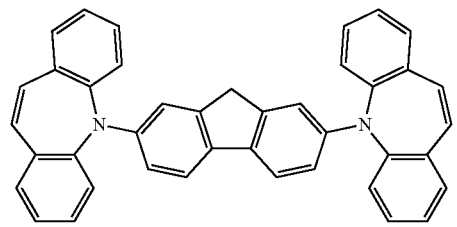

<FORMULA 7>

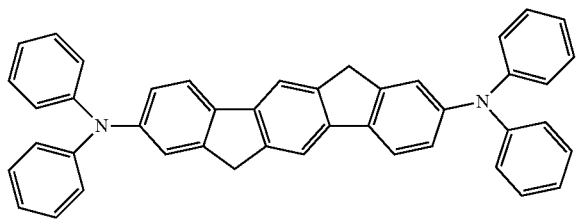

<FORMULA 8>

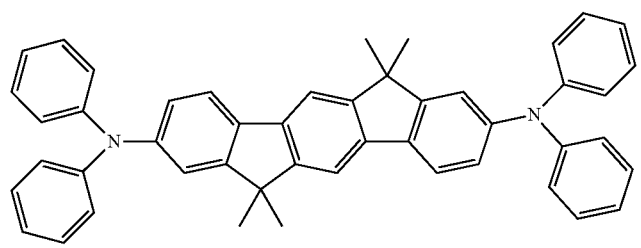

-continued

<FORMULA 9>

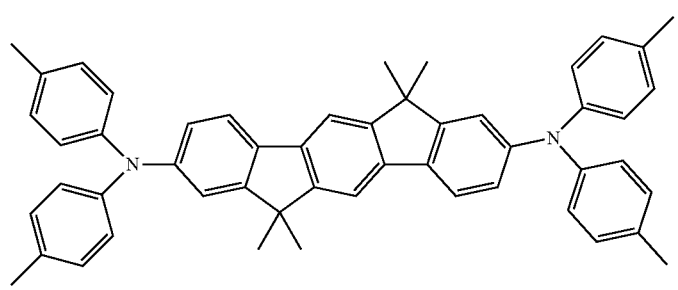

<FORMULA 10>

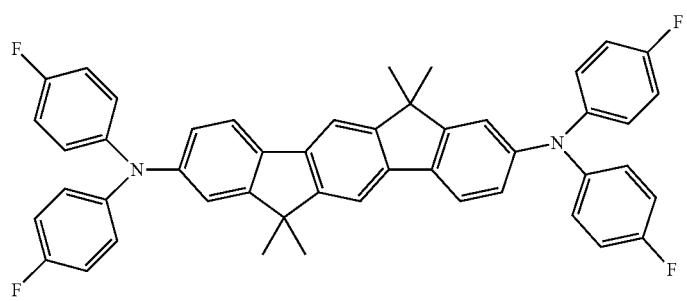

<FORMULA 11>

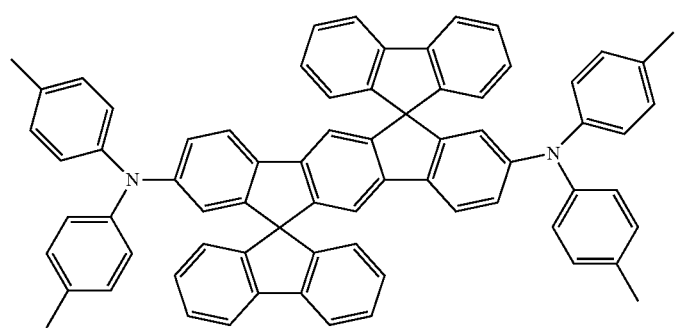

<FORMULA 12>

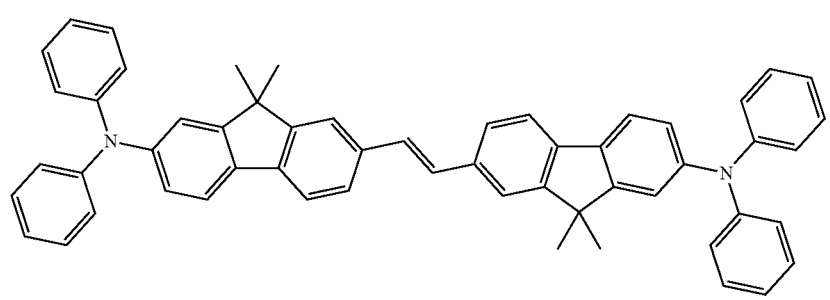

The pyrazine derivative used for the mixed organic layer may be represented by the formula below:

<FORMULA 13>

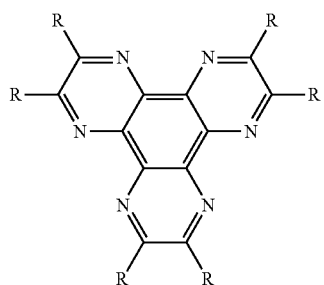

where R is a hydrogen atom, a C1-C10 alkyl group, an alkyloxy group, a dialkyl amine group, a halogen atom, or a cyano group.

In particular, the pyrazine derivative may be hexaazatriphenylenehexacarboxylnitrile represented by the formula below.

<FORMULA 14>

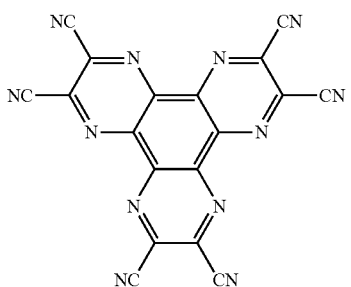

The amount of the pyrazine derivative may be in the range of 0.1 to 99.9 parts by weight, for example, 0.1 to 95 parts by weight based on 100 parts by weight of the mixed organic layer.

The thickness of the mixed organic layer including the triphenyl amine derivative and the pyrazine derivative may be in the range of about 2 to about 210 nm.

The organic light-emitting device including the mixed organic layer having the pyrazine derivative doping layer may have very low power consumption and high emission efficiency when the emission layer (EML) includes an anthracene derivative, an amine-containing styryl derivative, or any mixture thereof.

The anthracene derivative for forming the emission layer contains one or two directly connected anthracene moieties at the core of a molecule. For example, the anthracene derivative may be one of compounds represented by the following formulas, but is not limited thereto.

<FORMULA 15>

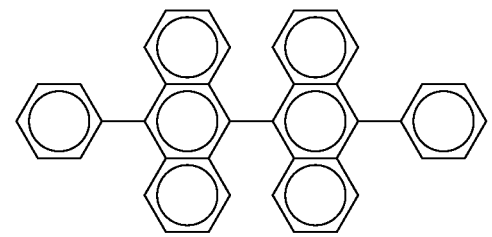

<FORMULA 16>

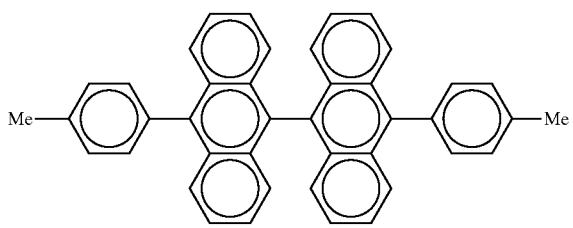

<FORMULA 17>

<FORMULA 18>

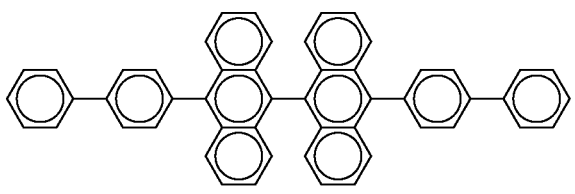

<FORMULA 19>

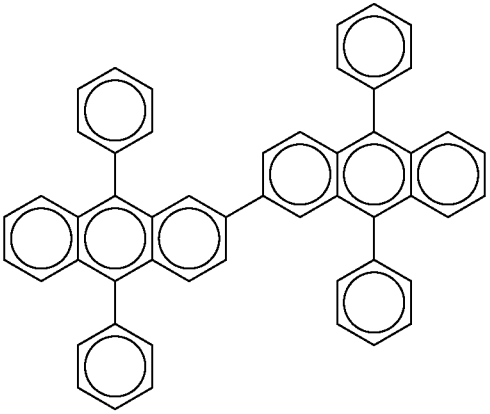

<FORMULA 20>

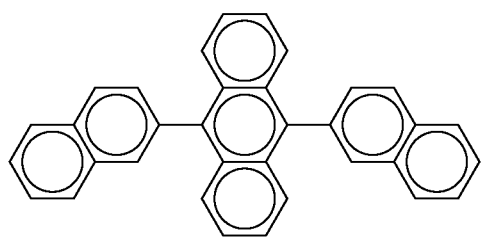

<FORMULA 21>

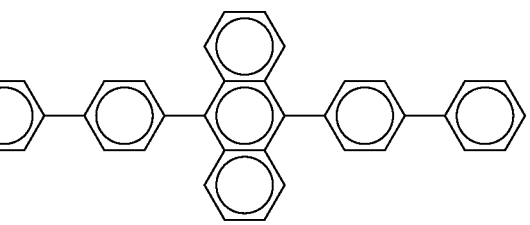

<FORMULA 22>

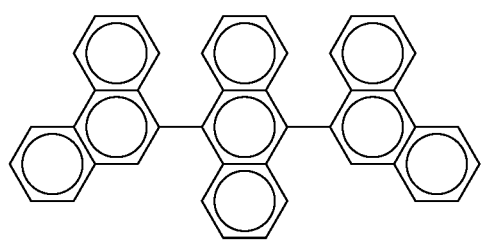

<FORMULA 23>

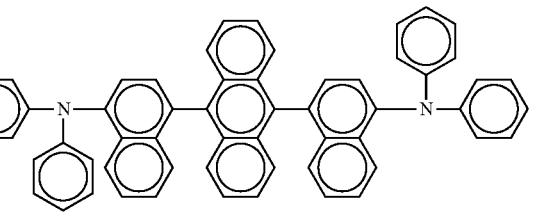

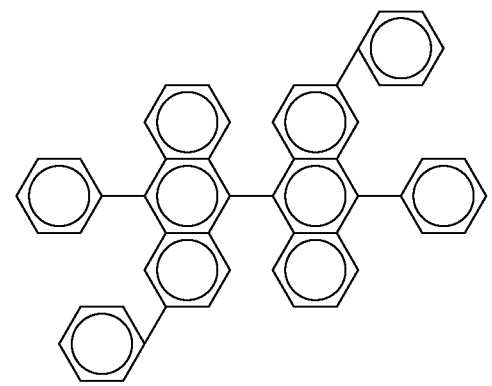

The amine-containing styryl derivative for forming the emission layer may be selected from the group consisting of an amine-containing monostyryl derivative, an amine-containing distyryl derivative, an amine-containing tristyryl derivative, and an amine-containing tetrastyryl derivative.

Particularly, the amine-containing styryl derivative may be one of compounds represented by the following formulas, but is not limited thereto.

(DPA), 2-(4-biphenyl)-5-(4-tert-butylphenyl)-1,3,4-oxadiazole (PBD), 8-hydroxyquinolinolato lithium (LiQ), or the like, but is not limited thereto.

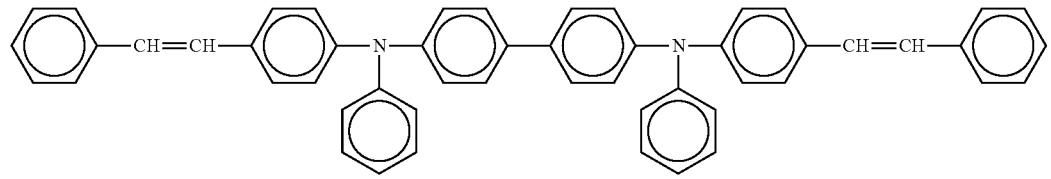

<FORMULA 24>

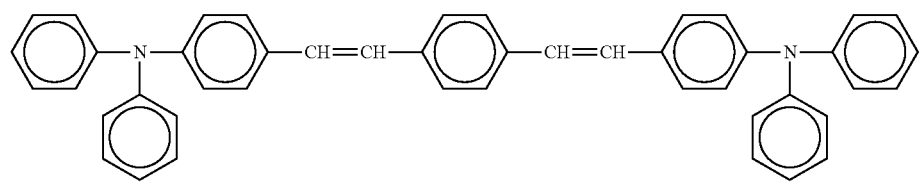

<FORMULA 25>

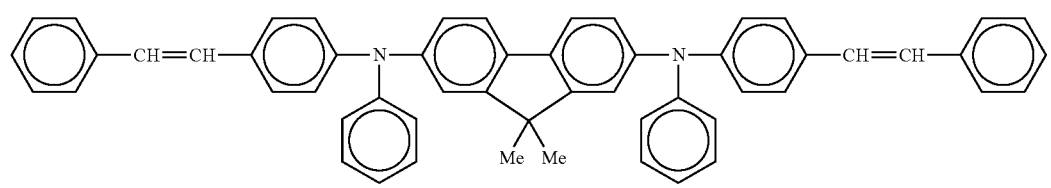

<FORMULA 26>

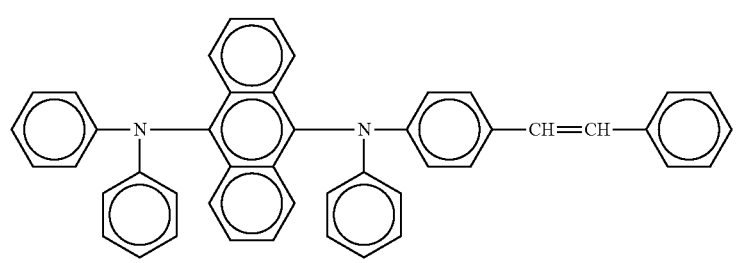

<FORMULA 27>

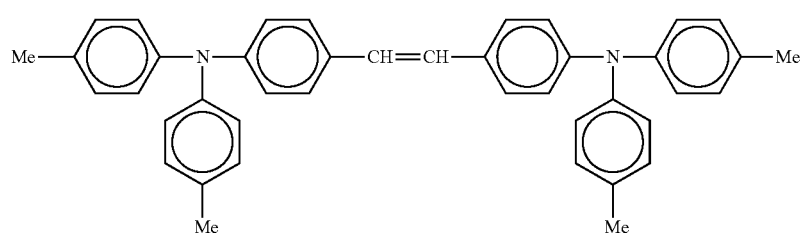

<FORMULA 28>

The electron transport layer (ETL) may be formed on the emission layer (EML). Any material that is commonly used in the art to form an electron transport layer (ETL) may be used to form the electron transport layer (ETL). For example, the electron transport layer (ETL) may be formed by co-depositing known materials such as quinoline derivative, particularly, tris(8-quinolinorate)aluminum ($Alq_3$), and 3-(4-Biphenylyl)-4-phenyl-5-tert-butylphenyl-1,2,4-triazole (TAZ), or an organic compound such as an anthracene derivative, a pyridine-containing polycyclic aromatic hydrocarbon derivative, and a pyrene derivative.

The known material used to form the electron transporting material may be TPBI, 4-naphthalene-1-yl-3,5-diphenyl-4-[1,2,4]-triazole (TAZ-1), 3,4,5-triphenyl-4-[1,2,4]triazole (TAZ-2), 3-biphenyl-4-yl-5-(4-tert-butyl-phenyl)-4-phenyl-4-[1,2,4]triazole (TAZ-3), 2-biphenyl-4-yl-5-(4-tert-butyl-phenyl)-[1,3,4]oxadiazole(PBD), tris(8-hydroxyquinoline) aluminum (Alq3), 4,7-diphenyl-[1,10]phenanthroline The anthracene derivative for forming the electron transport layer may be one of compounds represented by the following formulas, but is not limited thereto.

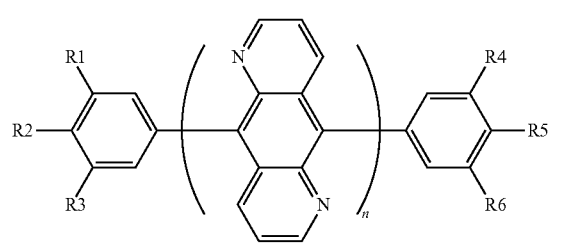

<FORMULA 29>

-continued

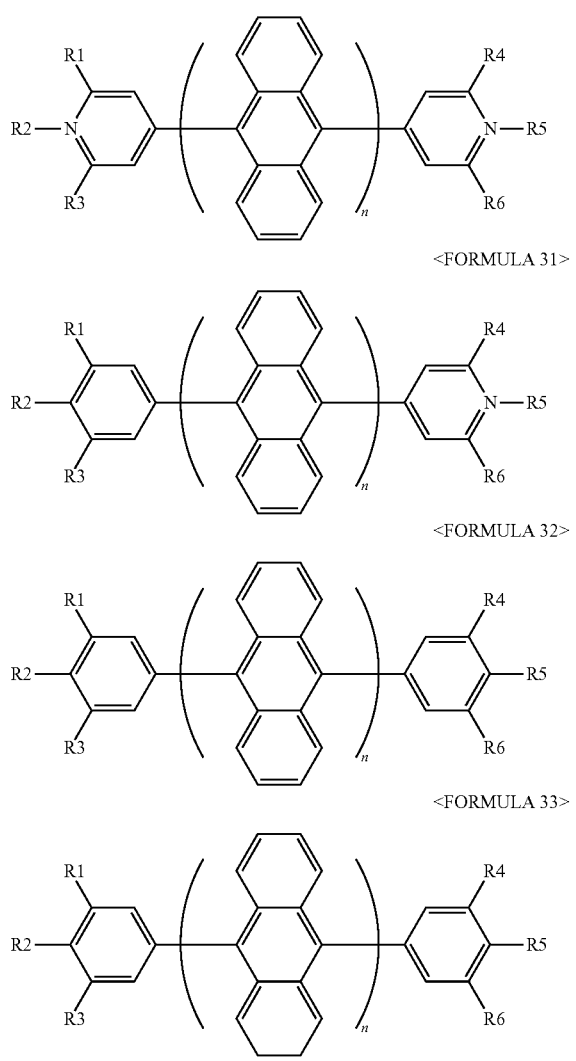

<FORMULA 30>

<FORMULA 31>

<FORMULA 32>

<FORMULA 33>

Here, n may be an integer from 1 to 6, R1, R2, R3, R4, R5, and R6 may be the same or each independently an unsaturated and/or condensed C2-C80 aromatic group such as vinyl, phenyl, and anthracene. However, R1, R2, R3, R4, R5, and R6 are not limited thereto, and may also be an aliphatic group such as —$CH_2$ or fluorene. R1, R2, R3, R4, R5, and R6 may be each independently substituted or unsubstituted phenyl, substituted or unsubstituted biphenyl, substituted or unsubstituted naphthyl, substituted or unsubstituted anthryl, substituted or unsubstituted pyrenyl, substituted or unsubstituted fluorenyl, substituted or unsubstituted naphthacenyl, substituted or unsubstituted N-methyl-N-phenylamino, substituted or unsubstituted N,N-diphenylamino, substituted or unsubstituted N-phenyl-N-(1-naphthyl)amino, N-phenyl-N-(2-naphthyl)amino, substituted or unsubstituted N,N-di(1-naphthyl)amino, substituted or unsubstituted N,N-di(2-naphthyl)amino or carbazolyl, substituted or unsubstituted p-carbazolyl phenyl or p-N,N-diphenylamino phenyl, substituted or unsubstituted methylene, substituted or unsubstituted pyrrolyl, substituted or unsubstituted thiophenyl, substituted or unsubstituted furanyl, substituted or unsubstituted pyrazolyl, substituted or unsubstituted imidazolyl, substituted or unsubstituted oxazolyl, substituted or unsubstituted thiazolyl, substituted or unsubstituted pyridyl, substituted or unsubstituted quinolyl, substituted or unsubstituted isoquinolyl, substituted or unsubstituted carbazolyl, substituted or unsubstituted phenanthridinyl, substituted or unsubstituted benzothiophenyl, substituted or unsubstituted benzofuranyl, substituted or unsubstituted benzimidazolyl, substituted or unsubstituted benzoxazolyl, substituted or unsubstituted benzothiazolyl, substituted or unsubstituted oxadiazolyl, substituted or unsubstituted pyrimidinyl, substituted or unsubstituted pyrazinyl, substituted or unsubstituted pyridazinyl, substituted or unsubstituted indolyl, substituted or unsubstituted phenyl, substituted or unsubstituted biphenyl, substituted or unsubstituted naphthyl, substituted or unsubstituted anthryl, substituted or unsubstituted pyrenyl, substituted or unsubstituted fluorenyl, substituted or unsubstituted naphthacenyl, substituted or unsubstituted phenylvinyl, substituted or unsubstituted naphthylvinyl, substituted or unsubstituted anthrylvinyl, substituted or unsubstituted fluorenyl vinyl, substituted or unsubstituted phenanthryl vinyl, substituted or unsubstituted biphenylvinyl, substituted or unsubstituted diphenylvinyl, substituted or unsubstituted phenylnaphthylvinyl, substituted or unsubstituted quinoxalinyl or carbazolyl, substituted or unsubstituted spiro(adamantane-2, 9'-fluorene), or substituted or unsubstituted anthracenyl.

The pyridine-containing polycyclic aromatic hydrocarbon derivative for forming the electron transport layer may be represented by the following formula, but is not limited thereto.

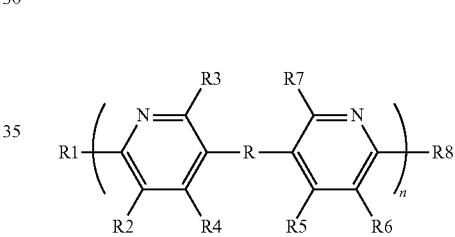

<FORMULA 34>

Here, n may be an integer from 1 to 6, R may be an unsaturated and/or condensed C2-C80 aromatic group such as vinyl, phenyl, and anthracene. However, R is not limited thereto, and may also be an aliphatic group such as —$CH_2$ or fluorene. In addition, the above-mentioned formula may have a bipyridine structure without R. R1, R2, R3, R4, R5, R6, R7, and R8 may be the same or each independently an unsaturated and/or condensed C2-C80 aromatic group such as vinyl, phenyl, and anthracene. However, R1 and R2 are not limited thereto, and may also be an aliphatic group such as —$CH_2$ or fluorene. R1 and R2 may be each independently substituted or unsubstituted phenyl, substituted or unsubstituted biphenyl, substituted or unsubstituted naphthyl, substituted or unsubstituted anthryl, substituted or unsubstituted pyrenyl, substituted or unsubstituted fluorenyl, substituted or unsubstituted naphthacenyl, substituted or unsubstituted N-methyl-N-phenylamino, substituted or unsubstituted N,N-diphenylamino, substituted or unsubstituted N-phenyl-N-(1-naphthyl)amino, N-phenyl-N-(2-naphthyl)amino, substituted or unsubstituted N,N-di(1-naphthyl)amino, substituted or unsubstituted N,N-di(2-naphthyl)amino or carbazolyl, substituted or unsubstituted p-carbazolyl phenyl or p-N,N-diphenylamino phenyl, substituted or unsubstituted methylene, substituted or unsubstituted pyrrolyl, substituted or unsubstituted thiophenyl, substituted or unsubstituted furanyl, substituted or unsubstituted pyrazolyl, substituted or unsubstituted imidazolyl, substituted or unsubstituted oxazolyl, substituted or unsubstituted thiazolyl, substituted or unsubstituted pyridyl, substituted or unsubstituted quinolyl, substituted or unsubstituted isoquinolyl, substituted or unsubstituted carbazolyl, substituted or unsubstituted phenanthridinyl, substituted or unsubstituted benzothio phenyl, substituted or unsubstituted benzaronyl, substituted or unsubstituted benzimidazolyl, substituted or unsubstituted benzoxazolyl, substituted or unsubstituted benzothiazolyl, substituted or unsubstituted oxadiazolyl, substituted or unsubstituted pyrimidinyl, substituted or unsubstituted pyrazinyl, substituted or unsubstituted pyridazinyl, substituted or unsubstituted indolyl, substituted or unsubstituted phenyl, substituted or unsubstituted biphenyl, substituted or unsubstituted naphthyl, substituted or unsubstituted anthryl, substituted or unsubstituted pyrenyl, substituted or unsubstituted fluorenyl, substituted or unsubstituted naphthacenyl, substituted or unsubstituted phenylvinyl, substituted or unsubstituted naphthylvinyl, substituted or unsubstituted anthrylvinyl, substituted or unsubstituted fluorenyl vinyl, substituted or unsubstituted phenanthryl vinyl, substituted or unsubstituted biphenylvinyl, substituted or unsubstituted diphenylvinyl, substituted or unsubstituted phenylnaphthylvinyl, substituted or unsubstituted quinoxalinyl or carbazolyl, substituted or unsubstituted spiro(adamantane-2,9'-fluorene), or substituted or unsubstituted anthracenyl.

The pyrene derivative for forming the electron transport layer may be one of compounds represented by the following formulae, but is not limited thereto.

<FORMULA 35>

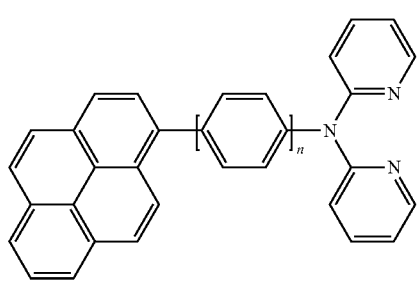

<FORMULA 36>

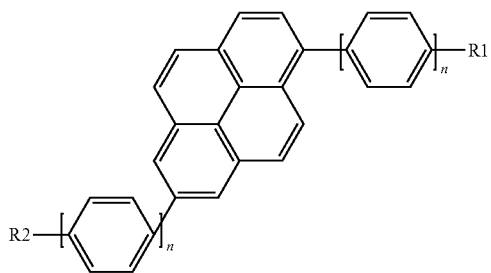

Here, n may be an integer from 1 to 6, and R1 and R2 may be an unsaturated and/or condensed C2-C80 aromatic group such as vinyl, phenyl, and anthracene. However, R1 and R2 are not limited thereto, and may also be an aliphatic group such as —$CH_2$ or fluorene. R1 and R2 may be each independently substituted or unsubstituted phenyl, substituted or unsubstituted biphenyl, substituted or unsubstituted naphthyl, substituted or unsubstituted anthryl, substituted or unsubstituted pyrenyl, substituted or unsubstituted fluorenyl, substituted or unsubstituted naphthacenyl, substituted or unsubstituted N-methyl-N-phenylamino, substituted or unsubstituted N,N-diphenylamino, substituted or unsubstituted N-phenyl-N-(1-naphthyl)amino, N-phenyl-N-(2-naphthyl)amino, substituted or unsubstituted N,N-di(1-naphthyl)amino, substituted or unsubstituted N,N-di(2-naphthyl)amino or carbazolyl, substituted or unsubstituted p-carbazolyl phenyl or p-N,N-diphenylamino phenyl, substituted or unsubstituted methylene, substituted or unsubstituted pyrrolyl, substituted or unsubstituted thiophenyl, substituted or unsubstituted furanyl, substituted or unsubstituted pyrazolyl, substituted or unsubstituted imidazolyl, substituted or unsubstituted oxazolyl, substituted or unsubstituted thiazolyl, substituted or unsubstituted pyridyl, substituted or unsubstituted quinolyl, substituted or unsubstituted isoquinolyl, substituted or unsubstituted carbazolyl, substituted or unsubstituted phenanthridinyl, substituted or unsubstituted benzothiophenyl, substituted or unsubstituted benzofuranyl, substituted or unsubstituted benzimidazolyl, substituted or unsubstituted benzoxazolyl, substituted or unsubstituted benzothiazolyl, substituted or unsubstituted oxadiazolyl, substituted or unsubstituted pyrimidinyl, substituted or unsubstituted pyrazinyl, substituted or unsubstituted pyridazinyl, substituted or unsubstituted indolyl, substituted or unsubstituted phenyl, substituted or unsubstituted biphenyl, substituted or unsubstituted naphthyl, substituted or unsubstituted anthryl, substituted or unsubstituted pyrenyl, substituted or unsubstituted fluorenyl, substituted or unsubstituted naphthacenyl, substituted or unsubstituted phenylvinyl, substituted or unsubstituted naphthylvinyl, substituted or unsubstituted anthrylvinyl, substituted or unsubstituted fluorenyl vinyl, substituted or unsubstituted phenanthryl vinyl, substituted or unsubstituted biphenylvinyl, substituted or unsubstituted diphenylvinyl, substituted or unsubstituted phenylnaphthylvinyl, substituted or unsubstituted quinoxalinyl or carbazolyl, substituted or unsubstituted spiro(adamantane-2,9'-fluorene), or substituted or unsubstituted anthracenyl.

The thickness of the hole transport layer (HTL) may be in the range of about 10 to about 100 nm.

In addition, the electron injection layer (EIL) that facilitates the injection of electrons from the second electrode (cathode) may be formed on the electron transport layer (ETL).

The electron injection layer (EIL) may be formed of a well-known material such as lithium quinolate, LiF, NaCl, CsF, $Li_2O$, and BaO. The thickness of the electron injection layer (EIL) may be in the range of about 0.1 to about 10 nm.

Then, the mixed organic layer, the hole injection layer (HIL), the hole transport layer (HTL), the emission layer (EML), the electron transport layer (ETL), and the electron injection layer (EIL) may be formed using various methods such as vacuum deposition, spin coating, casting, or the like.

The second electrode may be formed on the electron injection layer (EIL), on the electron transport layer (ETL) if the electron injection layer is not formed, or on the emission layer if both the electron injection layer and the electron transport layer are not formed, using a method such as vacuum deposition or sputtering. A material for forming the second electrode may include a metal, an alloy, or an electrically conductive compound, or materials which have a low work function, or a mixture thereof. Examples of such materials include lithium (Li), magnesium (Mg), aluminum (Al), aluminum-lithium (Al—Li), calcium (Ca), magnesium-indium (Mg—In), and magnesium-silver (Mg—Ag).

The organic light-emitting device according to the present embodiment includes the mixed organic layer having the pyrazine derivative doped on the triphenyl amine derivative and the emission layer (EML) including an anthracene derivative, an amine-containing styryl derivative, or a mixture thereof, thereby having high emission efficiency due to low power consumption. The organic light-emitting device according to the current embodiment may be applied to various types of flat panel display devices, such as a passive matrix organic light-emitting display device or an active matrix organic light-emitting display device.

The present invention will be described in further detail with reference to the following examples. These examples are for illustrative purposes only and are not intended to limit the scope of the present invention.

EXAMPLES

Characteristics of an organic light-emitting device that includes at least one blue emission layer (EML) between a first electrode and a second electrode were evaluated by doping a pyrazine derivative on a triphenyl amine compound including a fluorine moiety. The doping concentration was in the range of 0 to 100%, and the thickness of the doping was 0 to 2100 Å. The doping concentrations and thicknesses of the doping exhibiting excellent properties were selected. The thickness of an organic layer deposited during the manufacture of the organic light-emitting device was monitored using a crystal sensor.

Example 1

As a first electrode, a 15 Ω/cm² (1200 Å) ITO glass substrate (produced by Corning Co.) was cut to a size of 50 mm×50 mm×0.7 mm and then sonicated with isopropyl alcohol and pure water each for 5 minutes and washed by irradiation of ultraviolet rays for 30 minutes and exposure to ozone. Then, the resultant glass substrate was mounted on a vacuum deposition device.

4,4'-bis(3-methyl-9-carbazolyl)-1,1'-biphenyl and hexaazatriphenylenehexacarboxylnitrile were simultaneously vacuum deposited in a weight ratio of 97:3 on the substrate on which the first electrode is patterned to form a mixed organic layer having a thickness of 100 Å, and N,N'-diphenyl-N,N'-(3-methylphenyl)-1,1'-biphenyl-4,4'-diamine was vacuum deposited thereon to form a hole transport layer (HTL) having a thickness of 1300 Å.

An anthracene derivative that is Compound 1 represented by Formula 37 and an amine-containing styryl derivative that is Compound 2 represented by Formula 24 were simultaneously deposited in a weight ratio of 97:3 on the hole transport layer (HTL) to form an emission layer (EML) having a thickness of 300 Å.

Then, an anthracene derivative that is Compound 3 represented by Formula 38 and 8-hydroxyquinolinolato lithium (LiQ) were simultaneously deposited in a weight ratio of 1:1 on the emission layer (EML) to form an electron transport layer (ETL) having a thickness of 300 Å, LiQ was deposited on the electron transport layer (ETL) to form an electron injection layer (EIL) having a thickness of 5 Å, and 10% Mg:Ag was vacuum deposited on the electron injection layer (EIL) to form a second electrode having a thickness of 160 Å, and thus an organic light-emitting device was prepared.

<Compound 1>

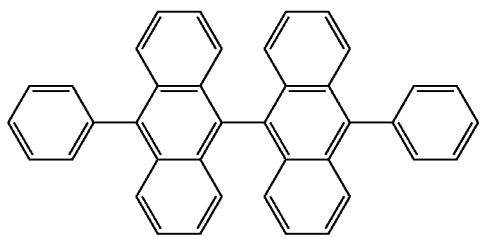

<FORMULA 37>

<Compound 2>

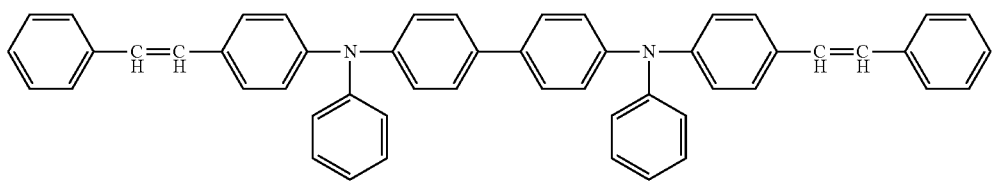

<FORMULA 24>

<Compound 3>

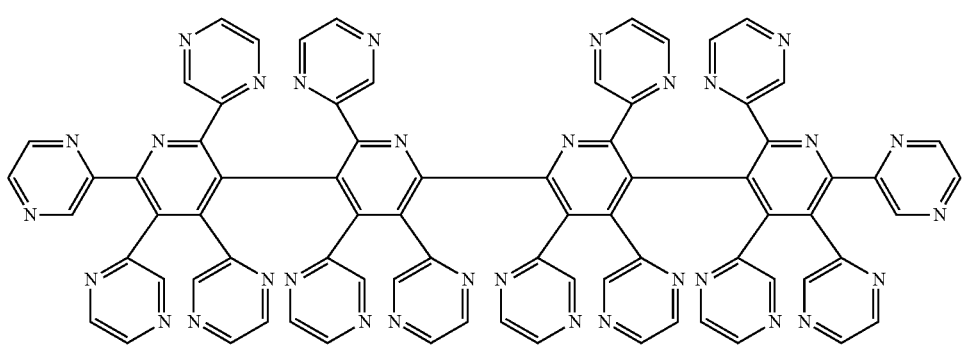

<FORMULA 38>

Example 2

An organic light-emitting device was prepared in the same manner as in Example 1, except that the anthracene derivative (i.e., Compound 1) alone was deposited on the hole transport layer (HTL).

Example 3

An organic light-emitting device was prepared in the same manner as in Example 1, except that triphenyl amine derivative that is Compound 4 represented by Formula 39 and hexaazatriphenylenehexacarboxylnitrile were simultaneously vacuum deposited in a weight ratio of 97:3 on the substrate on which the first electrode is patterned to form a mixed organic layer having a thickness of 100 Å, and the triphenyl amine derivative that is Compound 4 was vacuum deposited thereon to form a hole transport layer (HTL) having a thickness of 1300 Å.

<Compound 4>

<FORMULA 39>

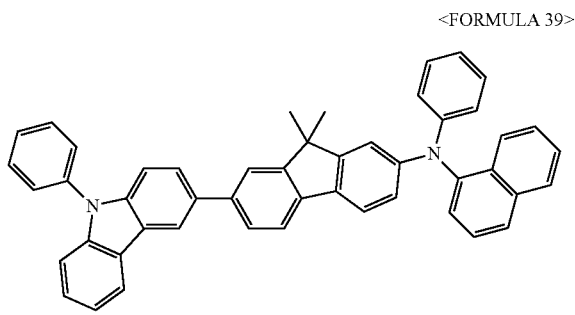

Comparative Example 1

An organic light-emitting device was prepared in the same manner as in Example 1, except that N,N'-diphenyl-N,N'-(3-methylphenyl)-1,1-biphenyl-4,4'-diamine was vacuum deposited on the first electrode which is patterned to form a hole transport layer (HTL) having a thickness of 1400 Å.

Comparative Example 2

An organic light-emitting device was prepared in the same manner as in Example 1, except that the triphenyl amine derivative that is Compound 4 was vacuum deposited on the first electrode which is patterned to form a hole transport layer (HTL) having a thickness of 1400 Å.

Comparative Example 3

An organic light-emitting device was prepared in the same manner as in Example 1, except that α-NPB and hexaazatriphenylenehexacarboxylnitrile were simultaneously vacuum deposited in a weight ratio of 97:3 on the substrate on which the first electrode is patterned to form a mixed organic layer having a thickness of 100 Å, and α-NPB was vacuum deposited thereon to form a hole transport layer (HTL) having a thickness of 1300 Å.

Evaluation Example

Efficiency and driving voltage of the organic light-emitting devices prepared according to Examples 1 and 2 and Comparative Example 1 were evaluated using a PR650 brightness meter and a 238 high current source measure unit of KEITHLEY. Voltages from DC 2.0 V to 5V at 0.5 V intervals were applied to the organic light-emitting devices, and more than 8 pieces of data were collected from each organic light-emitting device to evaluate the organic light-emitting devices. The results are shown in Table 1 below.

TABLE 1

| | Driving voltage (V) | Current density (A/cm$^2$) | Efficiency [(Cd/A)/y)] | Color coordinates |
|---|---|---|---|---|
| Comparative Example 1 | 4.3 | 10.4 | 71 | (0.148, 0.041) |
| Comparative Example 2 | 4.3 | 17.5 | 50 | (0.144, 0.048) |
| Comparative Example 3 | 4.1 | 15.3 | 53 | (0.144, 0.051) |
| Example 1 | 4.1 | 7.2 | 65 | (0.126, 0.074) |
| Example 2 | 3.8 | 10.2 | 78 | (0.147, 0.041) |
| Example 3 | 3.7 | 11.4 | 63 | (0.145, 0.048) |

Referring to Table 1, it was identified that the organic light-emitting devices prepared according to Examples 1, 2 and 3 had lower driving voltage than the organic light-emitting device prepared according to Comparative Example 1, 2 and 3.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting device, comprising:
a first electrode;
a second electrode;
an emission layer interposed between the first electrode and the second electrode, the emission layer comprising an anthracene derivative, an amine-containing styryl derivative, or a mixture thereof; and
a mixed organic layer interposed between the first electrode and the emission layer, the mixed organic layer comprising a triphenyl amine derivative and a pyrazine derivative.

2. The organic light-emitting device of claim 1, further comprising a hole transport layer between the emission layer and the mixed organic layer, or between the mixed organic layer and the first electrode.

3. The organic light-emitting device of claim 2, wherein the mixed organic layer is formed between the hole transport layer and the first electrode.

4. The organic light-emitting device of claim 1, wherein the triphenyl amine derivative is selected from the group consisting of triphenyl amine, tritolylamine, tolyldiphenylamine, N,N'-diphenyl-N,N'-(3-methylphenyl)-1,1-biphenyl-4,4'-diamine, N,N,N',N'-tetra(4-methylphenyl)-1,1'-phenyl-4,4'-diamine, N,N,N',N'-tetra(4-methylphenyl)-1,1'-biphenyl-4,4'-diamine, N,N'-diphenyl-N,N'-di(1-naphthyl)-1,1'-biphenyl-4,4'-diamine, N,N'-di(methylphenyl)-N,N'-di(4-n-butylphenyl)-phenanthrene-9,10-diamine, 4,4', 4''-tris(3-methylphenyl)-N-phenylamino)triphenyl amine, 1,1-bis(4-di-p-tolylaminophenyl)cyclohexane, and an oligomer or polymer having an aromatic tertiary amine structure thereof.

5. The organic light-emitting device of claim 1, wherein the triphenyl amine derivative comprises a carbazole moiety.

6. The organic light-emitting device of claim 1, wherein the triphenyl amine derivative comprises a fluorene moiety.

7. The organic light-emitting device of claim 6, wherein the triphenyl amine derivative comprised of the fluorene moiety is selected from the group consisting of the following formulas:

<FORMULA 4>

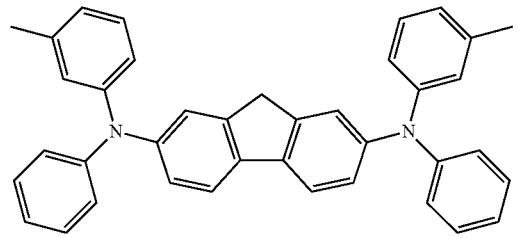

<FORMULA 5>

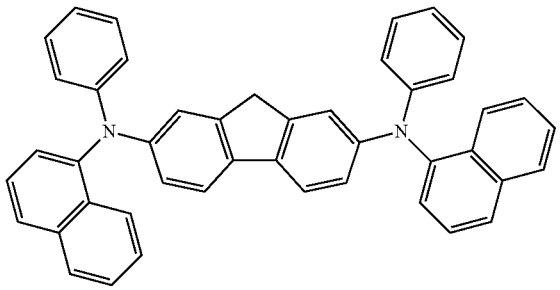

<FORMULA 6>

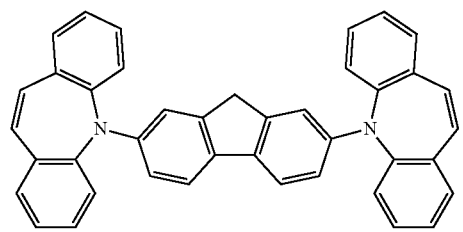

<FORMULA 7>

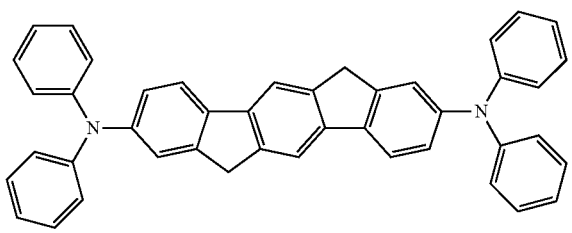

<FORMULA 8>

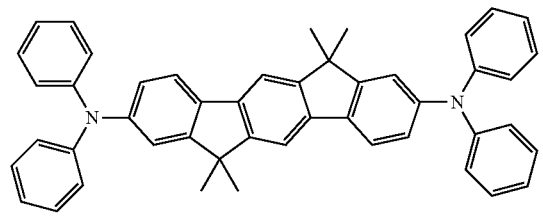

<FORMULA 9>

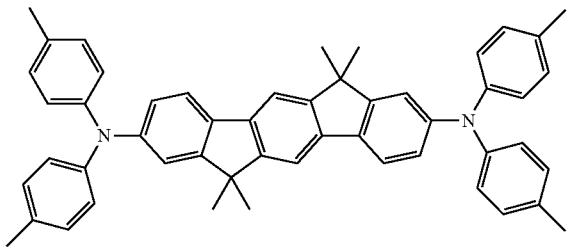

<FORMULA 10>

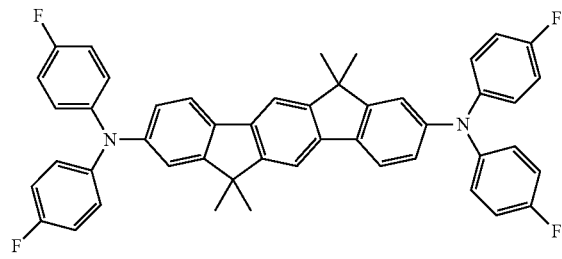

<FORMULA 11>

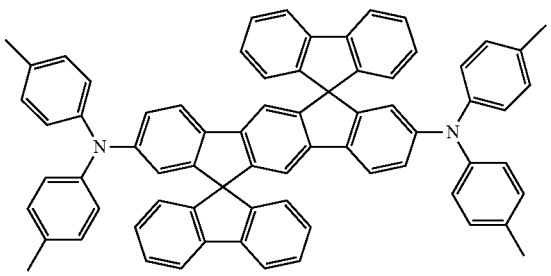

<FORMULA 12>

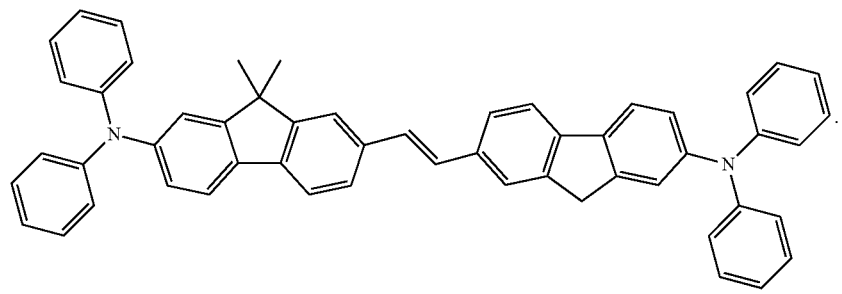

8. The organic light-emitting device of claim 1, wherein the pyrazine derivative is represented by Formula 13:

<FORMULA 13>

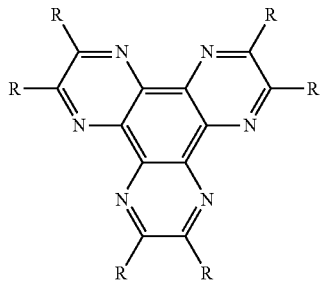

where R is a hydrogen atom, a C1-C10 alkyl group, an alkyloxy group, a dialkyl amine group, a halogen atom, or a cyano group.

9. The organic light-emitting device of claim 1, wherein the pyrazine derivative is hexaazatriphenylenehexacarboxylnitrile, represented by Formula 14:

<FORMULA 14>

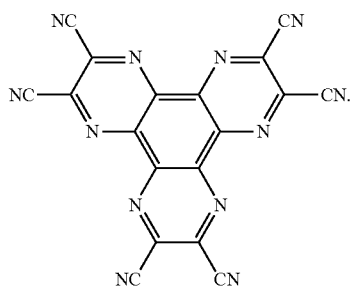

10. The organic light-emitting device of claim 1, wherein the thickness of the mixed organic layer is in the range of about 2 to about 210 nm.

11. The organic light-emitting device of claim 1, wherein the amount of the pyrazine derivative is in the range of 0.1 to 99.9 parts by weight based on 100 parts by weight of the mixed organic layer.

12. The organic light-emitting device of claim 1, wherein the emission layer comprises the anthracene derivative selected from the group consisting of the following formulas:

<FORMULA 15>

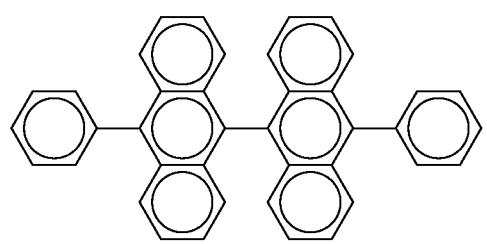

<FORMULA 16>

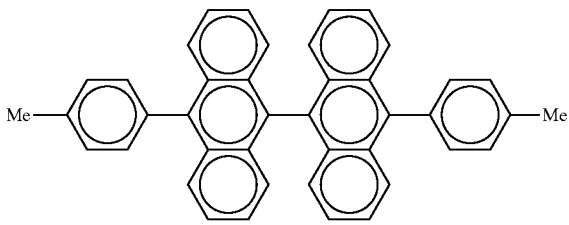

<FORMULA 17>

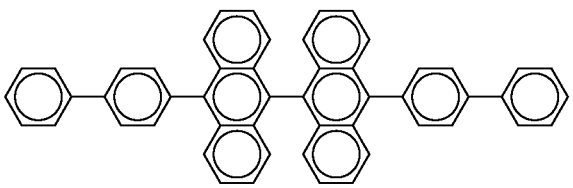

<FORMULA 18>

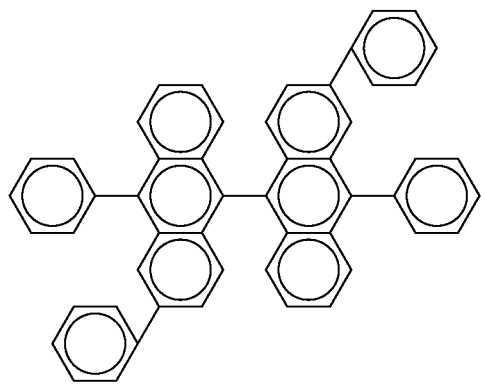

<FORMULA 19>

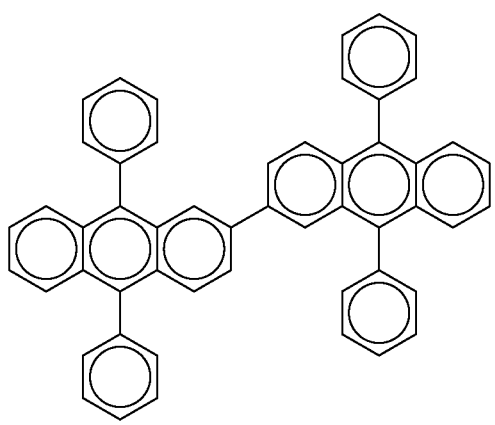

<FORMULA 20>

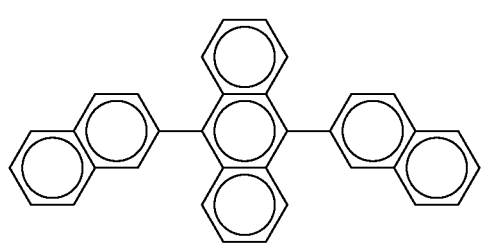

<FORMULA 21>

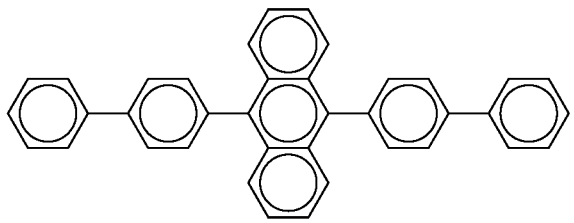

<FORMULA 22>

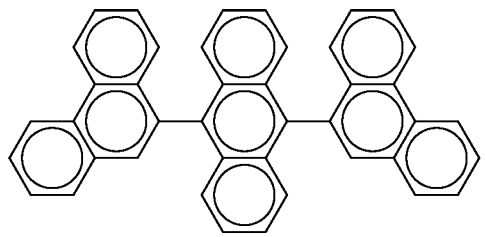

<FORMULA 23>

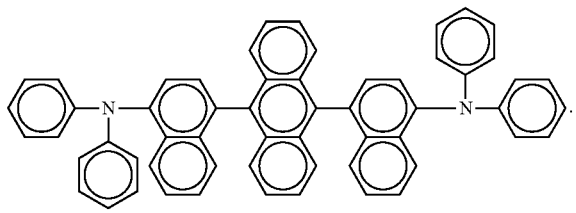

13. The organic light-emitting device of claim 1, wherein the emission layer comprises the amine-containing styryl derivative selected from the group consisting of an aminecontaining monostyryl derivative, an amine-containing distyryl derivative, an amine-containing tristyryl derivative, and an amine-containing tetrastyryl derivative.

14. The organic light-emitting device of claim 1, wherein the emission layer comprises the amine-containing styryl derivative selected from the group consisting of the following formulas:

<FORMULA 24>

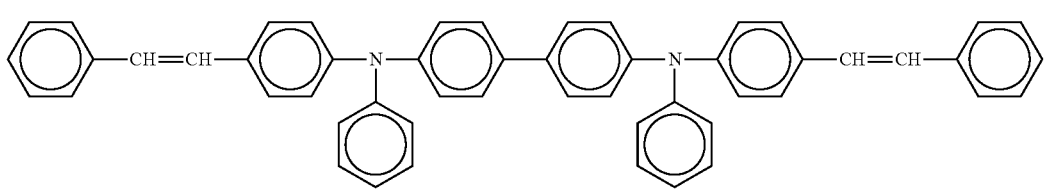

<FORMULA 25>

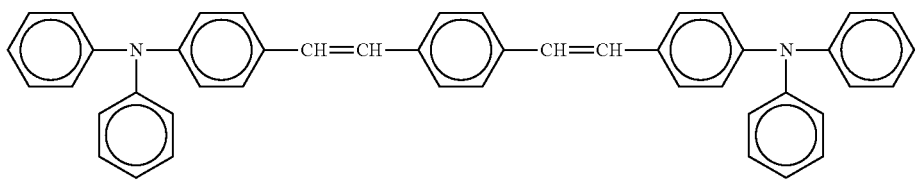

<FORMULA 26>

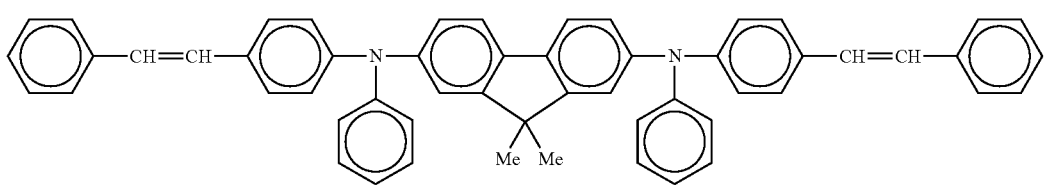

<FORMULA 27>

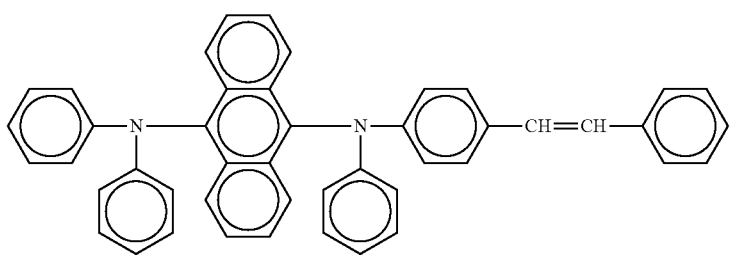

<FORMULA 28>

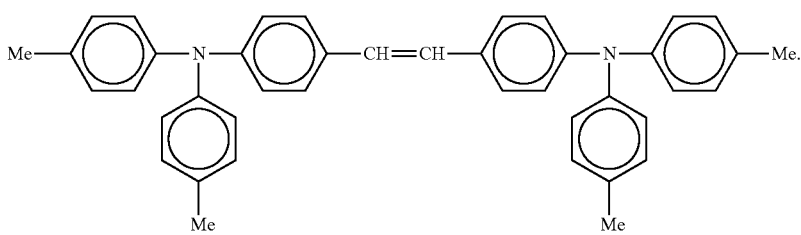

15. The organic light-emitting device of claim 2, wherein the hole transport layer is formed of a triaryl amine-based compound.

16. The organic light-emitting device of claim 2, wherein the thickness of the hole transport layer is in the range of about 3 to about 180 nm.

17. The organic light-emitting device of claim 1, further comprising an electron transport layer between the emission layer and the second electrode, the electron transport layer comprising lithium quinolate and an organic material.

18. An organic light-emitting device, comprising:
a first electrode;
a second electrode;
an emission layer interposed between the first electrode and the second electrode, the emission layer comprising an anthracene derivative, an amine-containing styryl derivative, or a mixture thereof; and
a mixed organic layer interposed between the first electrode and the emission layer, the mixed organic layer comprising a triphenyl amine derivative and a pyrazine derivative, the triphenyl amine derivative being selected from the group consisting of triphenyl amine, tritolylamine, tolyldiphenylamine, N,N'-diphenyl-N,N'-(3-methylphenyl)-1,1-biphenyl-4,4'-diamine, N,N,N',N',-tetra(4-methylphenyl)-1,1'-phenyl-4,4'-diamine, N,N,N',N'-tetra(4-methylphenyl)-1,1'-biphenyl -4,4'-diamine, N,N'-diphenyl-N,N'-di(1-naphthyl)-1,1'-biphenyl-4,4'-diamine, N,N'-di(methylphenyl)-N,N'-di(4-n-butylphenyl)-phenanthrene-9,10-diamine, 4,4',4"-tris(3-methylphenyl)-N-phenylamino)triphenyl amine, 1,1-bis(4-di-p-tolylaminophenyl)cyclohexane, an oligomer or polymer having an aromatic tertiary amine structure thereof, 4,4,'-bis(9-carbazolyl)-1,1'-biphenyl, 4,4'-bis(3-methyl-9-carbazolyl)-1,1'-biphenyl , 4,4',4"-tris(3-methylphenylamino)triphenylamine (m-MTDATA), N,N'-bis(3-methylphenyl)-N,N'-diphenyl-[1,1-biphenyl]-4,4'diamine (TPD), 4,4',4"-tri(N-carbazoyl)-triphenyl amine(TCTA), substituted or unsubstituted spirofluorene, substituted or unsubstituted indenofluorene, substituted or unsubstituted benzofluorene, a compound respresented by one of Formulas 4 through 12, and a combination thereof, the pyrazine derivative being represented by Formula 13:

<FORMULA 4>

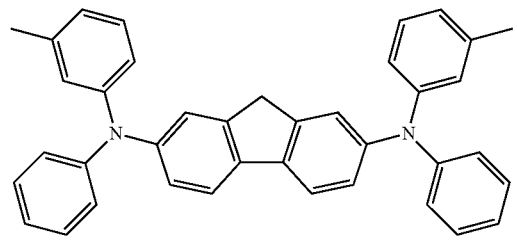

<FORMULA 5>

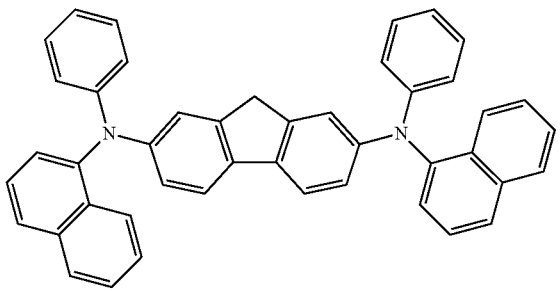

<FORMULA 6>

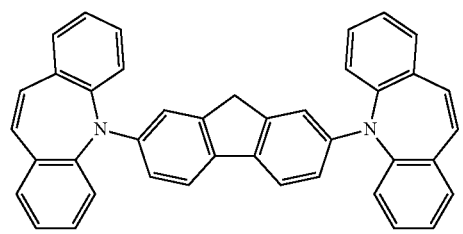

<FORMULA 7>

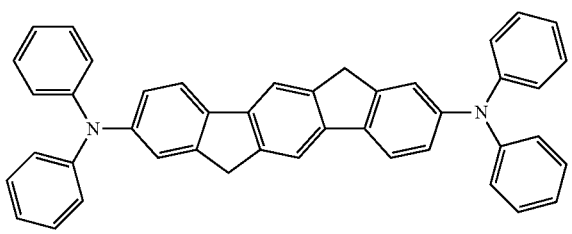

<FORMULA 8>

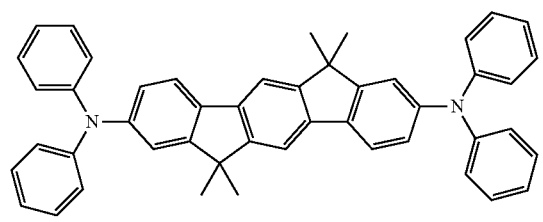

<FORMULA 9>

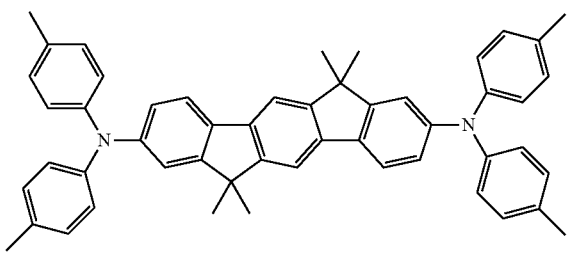

-continued

<FORMULA 10>

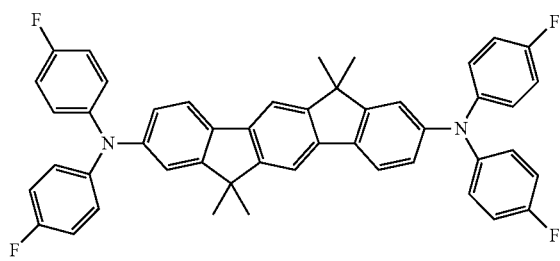

<FORMULA 11>

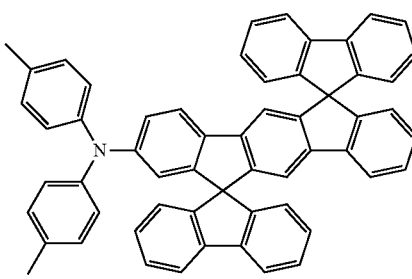

<FORMULA 12>

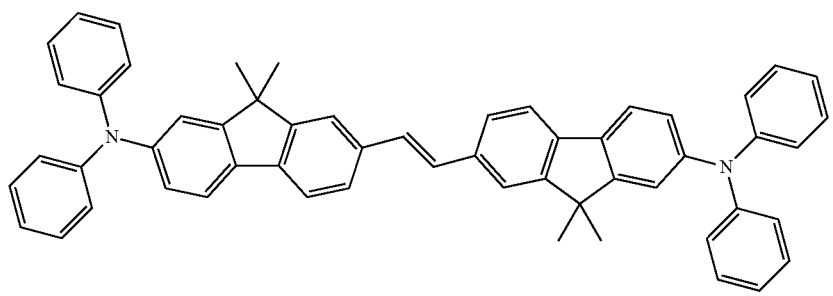

<FORMULA 13>

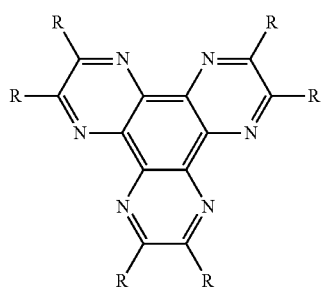

where R is a hydrogen atom, a C1-C10 alkyl group, an alkyloxy group, a dialkyl amine group, a halogen atom, or a cyano group.

19. The organic light-emitting device of claim 18, wherein the anthracene derivative of the emission layer is selected from the group consisting of the following formulas:

<FORMULA 15>

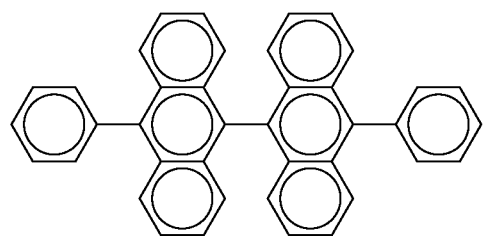

<FORMULA 16>

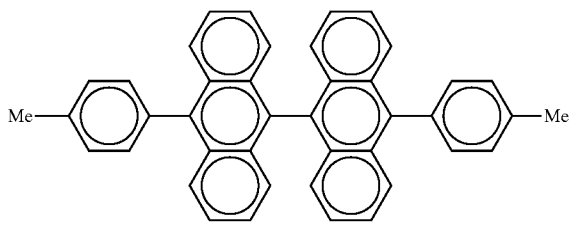

-continued

<FORMULA 17>

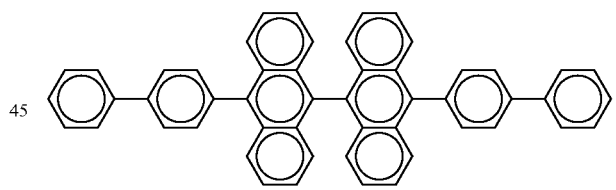

<FORMULA 18>

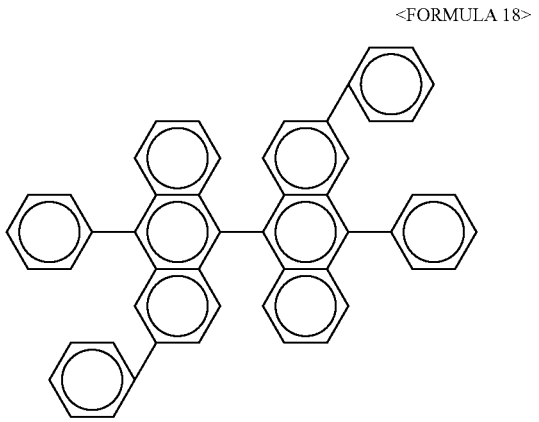

<FORMULA 19>
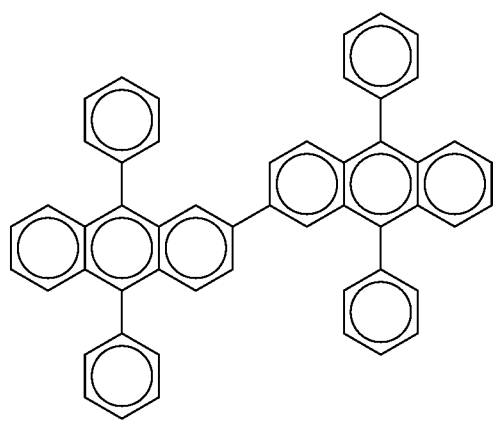
<FORMULA 22>
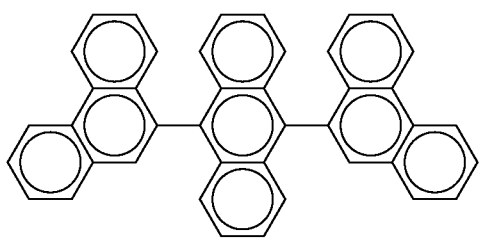
<FORMULA 20>
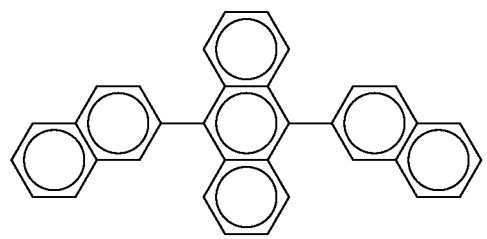
<FORMULA 23>
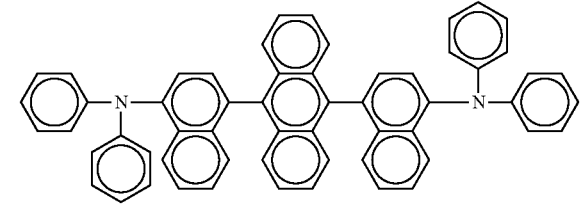
<FORMULA 21>
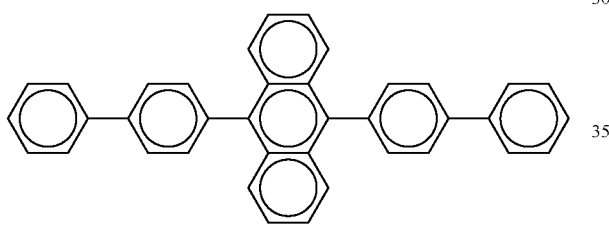
the amine-containing styryl derivative being selected from the group consisting of the following formulas:
<FORMULA 24>
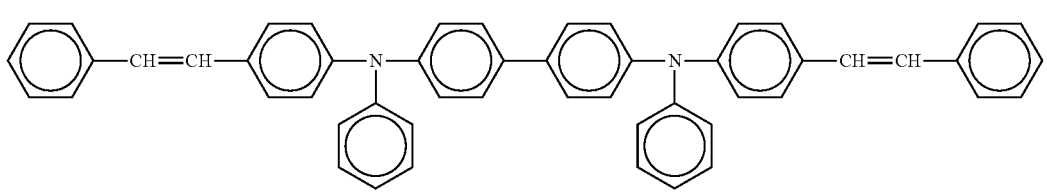
<FORMULA 25>
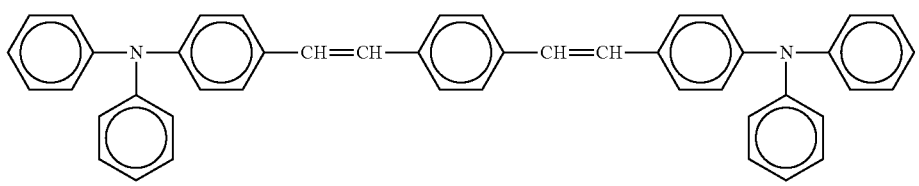
<FORMULA 26>
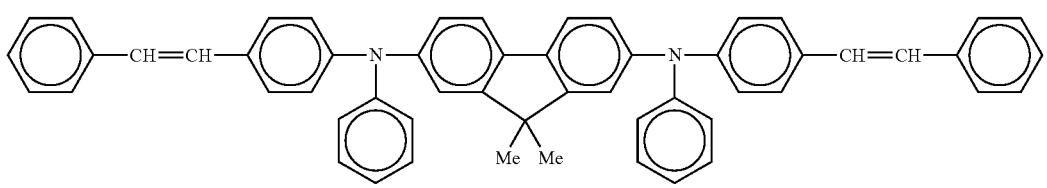

-continued

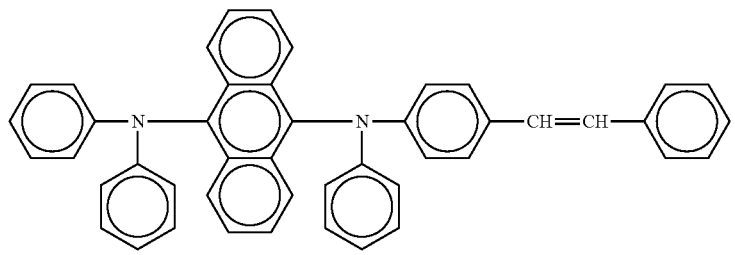

<FORMULA 27>

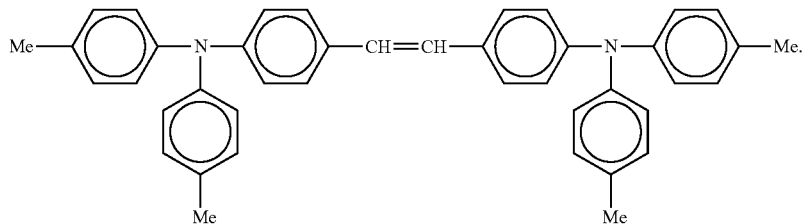

<FORMULA 28>

20. An organic light-emitting device comprising:
a first electrode;
a second electrode;
an emission layer interposed between the first electrode and the second electrode, the emission layer comprising an anthracene derivative, an amine-containing styryl derivative, or a mixture thereof;
at least one of a hole transport layer and a hole injection layer between the emission layer and the first electrode; and
a mixed organic layer interposed between the first electrode and the emission layer, the mixed organic layer comprising a triphenyl amine derivative and a pyrazine derivative.

* * * * *